(12) United States Patent
Joo et al.

(10) Patent No.: US 8,222,630 B2
(45) Date of Patent: Jul. 17, 2012

(54) ORGANIC MEMORY DEVICE HAVING MEMORY ACTIVE REGION FORMED BY EMBOSSING STRUCTURE

(75) Inventors: Won Jae Joo, Hwaseong-Si (KR); Kwang Hee Lee, Suwon-Si (KR); Sang Kyun Lee, Seongnam-Si (KR); Tae Lim Choi, Seongnam-Si (KR)

(73) Assignee: Samsung Electronics Co., Ltd. (KR)

( * ) Notice: Subject to any disclaimer, the term of this patent is extended or adjusted under 35 U.S.C. 154(b) by 942 days.

(21) Appl. No.: 11/402,376

(22) Filed: Apr. 12, 2006

(65) Prior Publication Data
US 2007/0063193 A1    Mar. 22, 2007

(30) Foreign Application Priority Data
Sep. 16, 2005  (KR) .......................... 10-2005-0086931

(51) Int. Cl.
*H01L 45/00* (2006.01)
*H01L 51/10* (2006.01)

(52) U.S. Cl. .............. 257/40; 257/E29.17; 257/E51.008

(58) Field of Classification Search ................. 248/74.3, 248/218.4, 188.1; 297/195.1, 215.13; 257/40, 257/E51.002, E51.003, E51.008
See application file for complete search history.

(56) References Cited

U.S. PATENT DOCUMENTS

| | | | |
|---|---|---|---|
| 6,431,423 B1 * | 8/2002 | Allen et al. .................... 224/509 |
| 6,565,763 B1 * | 5/2003 | Asakawa et al. ................. 216/56 |
| 6,614,048 B2 * | 9/2003 | Leuschner ...................... 257/40 |
| 6,656,763 B1 * | 12/2003 | Oglesby et al. ................. 438/99 |
| 6,807,714 B2 * | 10/2004 | O'Young et al. ............. 24/16 PB |
| 6,825,060 B1 * | 11/2004 | Lyons et al. ..................... 438/82 |
| 7,090,784 B2 * | 8/2006 | Asakawa et al. ................. 216/41 |
| 7,097,781 B2 * | 8/2006 | Asakawa et al. ................. 216/56 |
| 7,625,694 B2 * | 12/2009 | Marsh et al. .................. 430/323 |
| 2002/0185581 A1 * | 12/2002 | Trask ............................ 248/408 |

* cited by examiner

*Primary Examiner* — Lynne Gurley
*Assistant Examiner* — Andrew O. Arena
(74) *Attorney, Agent, or Firm* — Cantor Colburn LLP (57) ABSTRACT

An organic memory device having a memory active region formed by an embossing structure. This invention provides an organic memory device including a substrate, a first electrode formed on the substrate, an organic memory layer formed on the first electrode, a second electrode formed on the organic memory layer and an embossing structure provided at the organic memory layer to form a memory active region.

21 Claims, 9 Drawing Sheets

FIG. 1

PRIOR ART

FIG. 2

PRIOR ART

ORGANIC MEMORY DEVICE HAVING MEMORY ACTIVE REGION FORMED BY EMBOSSING STRUCTURE

This application claims priority to Korean Patent Application No. 2005-86931 filed on Sep. 16, 2005 and all the benefits accruing therefrom under 35 U.S.C. §119, the contents of which are herein incorporated by reference in its entirety.

BACKGROUND OF THE INVENTION

1. Field of the Invention

The present invention relates, generally, to an organic memory device having a memory active region formed by an embossing structure, and more particularly, to an organic memory device in which a memory active region is formed, thereby decreasing distribution of switching time, resulting in increased reliability of the device.

2. Description of the Related Art

With the remarkable development of information and communication industries, the demand for various memory devices has drastically increased. In particular, memory devices necessary for portable terminals, smart cards, digital cameras, games, MP3 players, etc., require nonvolatile characteristics. Nonvolatile memory, such as flash memory based on a silicon material, is mainly used.

However, conventional flash memory is disadvantageous because it has a limited number of recording/erasing times and slow recording speed. Moreover, manufacturing cost for increasing the degree of integration is high, and manufacturing techniques of the chips are difficult, making them incapable of being further miniaturized. Thus, thorough attempts have been made to develop next-generation nonvolatile memory devices that realize ultrahigh speeds, high capacities, low prices and ultra-small sizes, overcoming the physical limitations of conventional silicon flash memory.

In this regard, the next-generation memory devices are classified into ferroelectric random access memory (RAM), magnetic RAM, phase-change RAM, nanotube RAM, holographic memory, organic memory, etc., depending on the type of material constituting a unit cell in a semiconductor.

Figure 1:
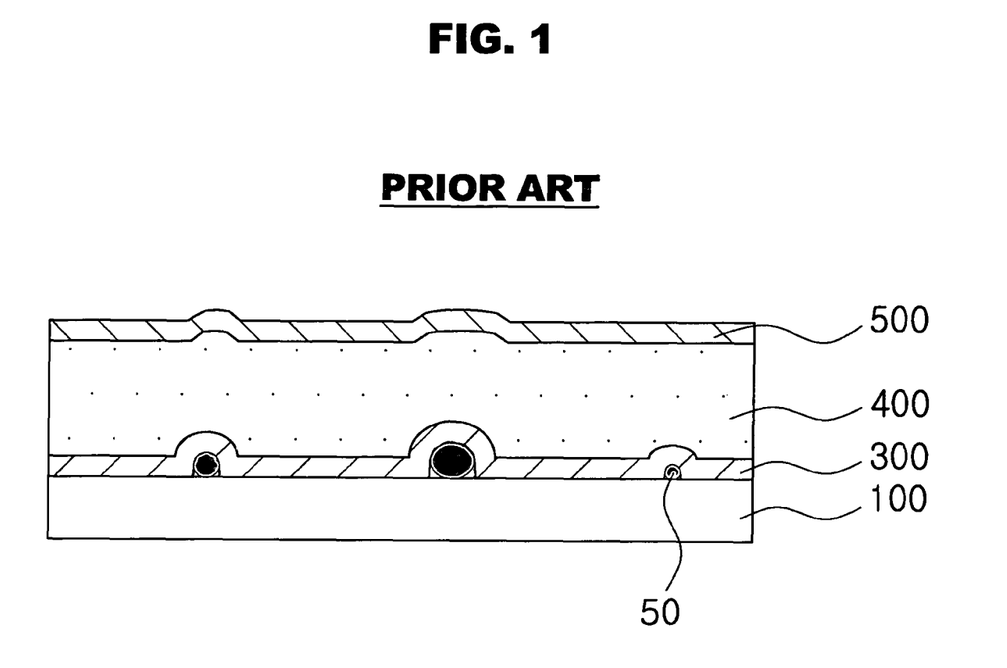
FIG. 1 is a cross-sectional view showing an organic memory device according to a conventional technique.

Of these memory devices, organic memory achieves memory capability using bistability of resistance resulting from the application of voltage to an organic material provided between upper and lower electrodes. FIG. 1 is a schematic cross-sectional view showing an organic memory device according to a conventional technique. As shown in FIG. 1, such a conventional organic memory device is formed by including an organic memory layer 400 between a first electrode 300 and a second electrode 500 on a substrate 100.

Figure 2:
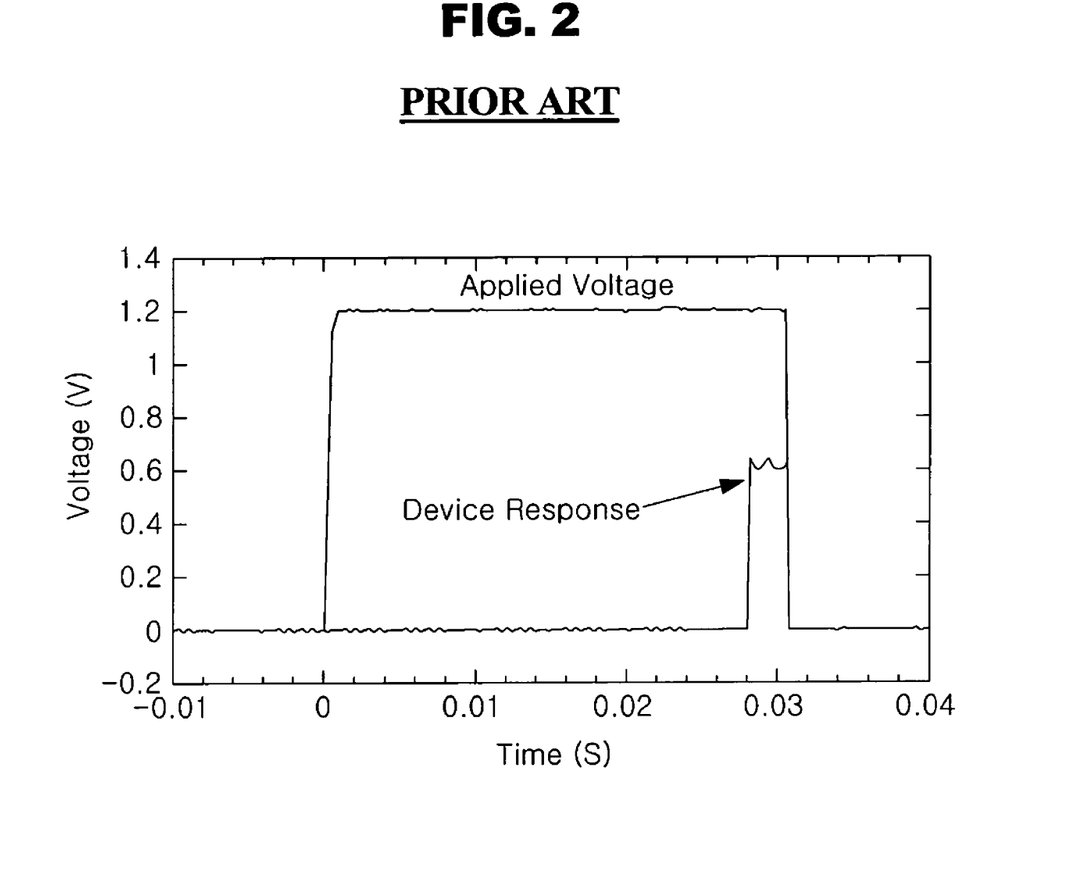
FIG. 2 is a graph showing switching delay of a conventional organic memory device.

The memory operation of the organic memory device is realized by reversible switching between at least two resistance states. FIG. 2 is a graph showing voltage relative to switching time of a conventional organic memory device. As is apparent from FIG. 2, in the case where a uniform voltage pulse is applied to the memory device for switching, an actual response of the device occurs after a predetermined time delay from the application of voltage, rather than occurring immediately upon application of the voltage. As the demand for high-speed devices has gradually increased in recent years, the switching speed of the memory device has also become faster, to 40 nanoseconds (ns) or less. However, the switching delay time is relatively slow, such as to ones of to tens of microseconds (µs), and is thus problematic.

Unlike a conventional silicon-based memory device, which is typically manufactured in a sterile environment, the organic memory device may be manufactured by a relatively inexpensive process, such as a solution process. Since the organic memory device may be manufactured in a working environment where the cleanliness cannot be expected, the organic memory device may be readily exposed to contaminants such as dust. Therefore, as sown in FIG. 1, dust or defects 50 may be generated between the substrate 100 and the first electrode 300. If so, the thickness of the organic memory layer 400 of the organic memory device may become non-uniform. The organic memory layer 400 of the organic memory device may be prepared to a thickness of 20 to 100 nanometers (nm) and fine dust of 100 nm or less may greatly negatively affect performance of the device.

Since a portion of the organic memory layer 400 thickness decreased by and that is relatively thin due to the dust or defects 50 requires the application of high current or electrical field, switching by current or electrical field may increasingly occur at the portion of the organic memory layer 400 where dust is present or defects 50 are generated. In addition, the memory device having dust or defects has a non-uniform or very wide distribution of switching delay time attributed to the irregular generation of dust or defects, undesirably increasing defect rates upon manufacturing of the memory device and causing a problem of deteriorating switching precision and accuracy of the finally manufactured memory device. If the memory device has too wide a distribution of switching delay time, the memory device may not be capable of functioning or applied as a memory device.

In the case where fine dust or defects occur during manufacturing processes of the memory device, generation frequencies of such defects are in proportion to the total area of an active region. The memory device that may be composed of hundreds of millions of cells may be targeted for decrease the total area of the cells through reduction of the size of a unit cell and additional difficulties may be incurred in terms of cost and process.

SUMMARY OF THE INVENTION

An exemplary embodiment according to the present invention provides an organic memory device that is improved in precision and accuracy of switching.

Another exemplary embodiment according to the present invention provides a method of manufacturing an organic memory device, capable of decreasing defect rates of the memory device and reducing the effective area thereof.

Another exemplary embodiment according to the present invention provides an organic memory device including a substrate, a first electrode formed on the substrate, an organic memory layer formed on the first electrode, a second electrode formed on the organic memory layer and an embossing structure provided at portions of the organic memory layer to form a memory active region.

Another exemplary embodiment according to the present invention provides a method of forming an organic memory device, the method including disposing a first electrode on a substrate, forming an organic memory layer on the first electrode, forming a second electrode on the organic memory layer and providing an embossing structure at portions of the organic memory layer to form a memory active region.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a detailed description will be given of the present invention, with reference to the appended drawings.

Figure 3:
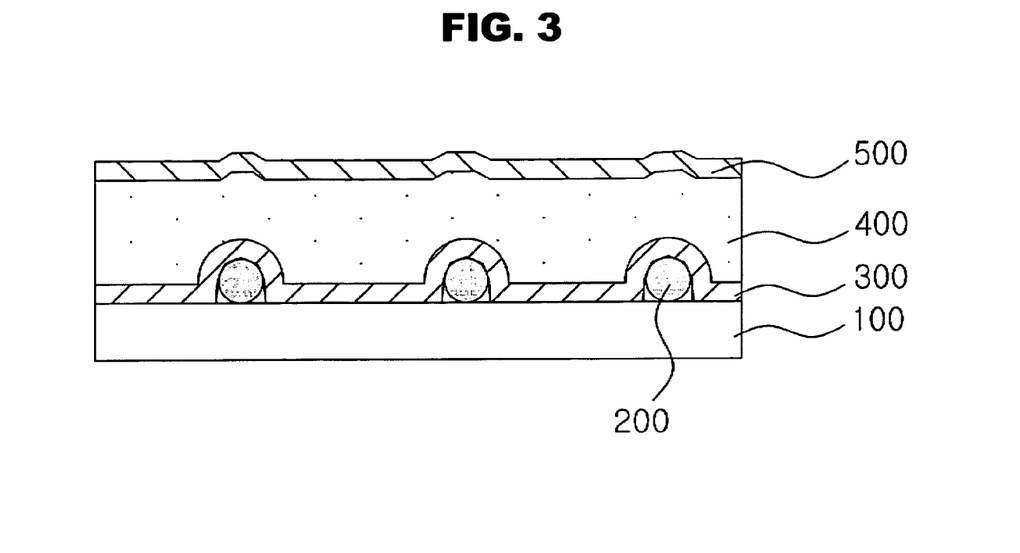
FIG. 3 is a cross-sectional view showing an exemplary embodiment of an organic memory device according to the present invention.

FIG. 3 is a cross-sectional view showing an exemplary embodiment of an organic memory device according to the present invention. As shown in FIG. 3, the memory device is structured in a manner such that an embossing structure 200 in substantially particle form is discontinuously distributed on a substrate 100. The embossing structure 200 may be considered "discontinuous" as particles may be spaced apart from each other along the substrate 100 at varying distances. A first electrode 300, an organic memory layer 400, and a second electrode 500 are sequentially formed on such a substrate 100.

The embossing structure 200 disposed at portions of the organic memory layer 400 for formation of a memory active region may be made of a conducting material or an insulating material. In one exemplary embodiment of a method of manufacturing a memory device, the embossing structure 200 may be formed by mixing organic or inorganic particles having a diameter in a range of about 10 nm to about 500 nm with a binder polymer and a solvent to obtain a mixture. The particles may include a substantially round or spherical shape. The mixture is applied onto the substrate 100, such as through a spin-coating process to thus form and distribute the embossing structure 200 on the surface of the substrate 100. The substrate 100 is coated with the first electrode 300. The first electrode 300 may also be formed on or over the embossing structure 200 disposed on the surface of the substrate 100. The organic memory layer 400 is formed on the first electrode 300. The organic memory layer 400 may be formed through a solution process, such as spin-coating. The second electrode 500 is formed on the organic memory layer 400.

Figure 4:
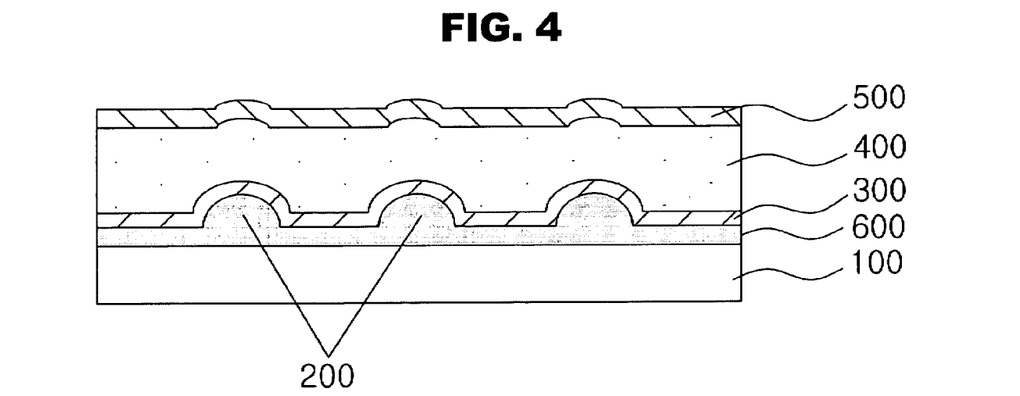
FIG. 4 is a cross-sectional view showing another exemplary embodiment of an organic memory device according to the present invention.

FIG. 4 is a cross-sectional view showing another exemplary embodiment of an organic memory device according to the present invention. The memory device is structured in a manner such that an embossing structure 200 is formed on an additional layer 600 provided on a substrate 100. The embossing structure 200 essentially is formed in a shape or profile corresponding to the additional layer 600 formed on the substrate 100. The embossing structure 200 may be disposed under the organic insulating layer 400 to form the memory active region.

The organic insulating layer 400 second electrode 500 may be a substantially planar shape, but portions of the organic insulating layer 400 and the second electrode 500 may be distorted in an area corresponding to the embossing structure 200 where the embossing structure 200 protrudes upward from the substrate 100. Thickness of the organic insulating layer 400 may be reduced at areas corresponding to the embossing structure. The shape or dimensions of the portion of the organic insulating layer 400 and the second electrode 500 that is distorted may substantially correspond to the shape and size of the embossing structure 200 as illustrated in FIGS. 3 and 4. The embossing structure 200 is effectively provided at portions of the organic insulating layer 400 to form a memory active region.

In one exemplary embodiment of a method of manufacturing a memory device, the embossing structure 200 may be formed on the additional layer 600 formed via surface-relief grating using radiation of interference light onto a polymer or monomer. The polymer or monomer may include an azobenzene (azo) group, photolithography, block copolymer etching, e-beam lithography, or any combination including at least one of the foregoing.

In another exemplary embodiment including an azobenzene polymer in the additional layer 600, the polymer is arrayed perpendicular to a polarization direction of light. The polymer moves according to intensity of light, causing a thickness of the polymer to vary. Using this phenomenon, the additional layer 600 composed of such an azobenzene polymer is prepared, exposed to a light beam interference pattern, rotated to 90°, and then exposed to a light beam interference pattern.

Figure 5:
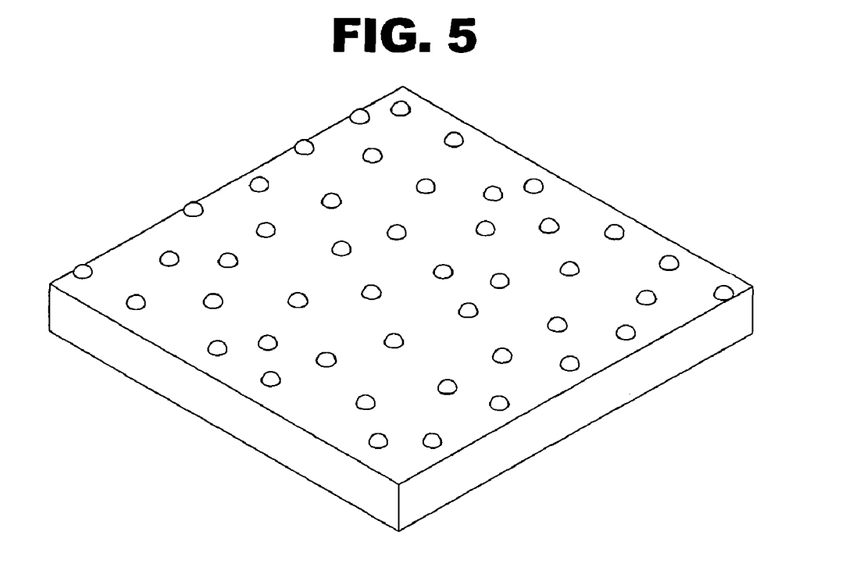
FIGS. 5 to 7 are perspective views showing exemplary embodiments of memory active regions formable via photolithography.

The embossing structure 200 formed on the additional layer 600 may have a substantially uniform dot array as shown in FIG. 5. The uniform dot array may be considered as the dimensions and profiles of the embossing structure 200 are substantially similar (or uniform) across a distribution of the embossing structure 200. In other exemplary embodiments, the spacing or intervals of the embossing structure 200 distributed across the substrate 100 may be varied or random as illustrated in FIG. 5, or may be substantially uniform.

Figure 6:
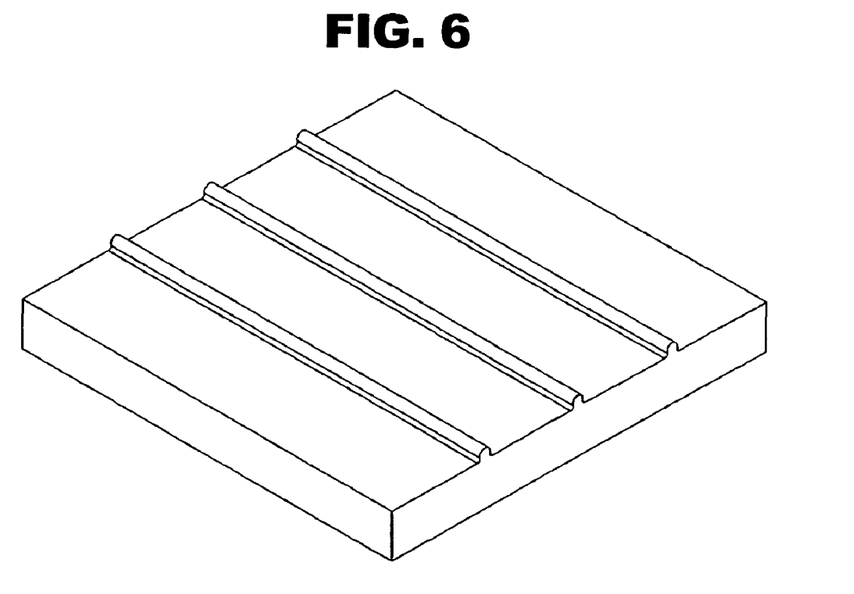
Figure 7:
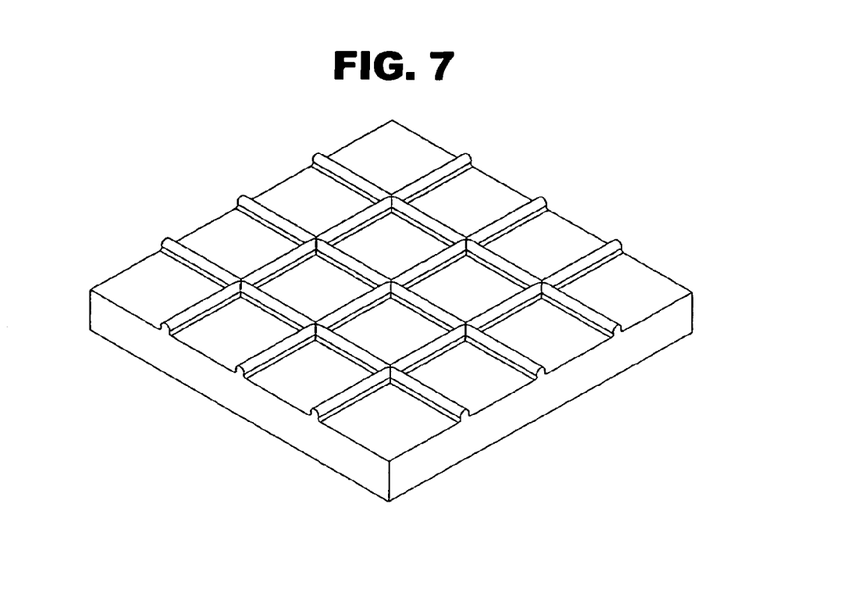

In another exemplary embodiment of a method of manufacturing a memory device, the additional layer 600 may be formed by a photolithography process. A photoresist is applied onto a substrate, baked, exposed using a mask, and then developed, to form an embossing structure having a desired shape. Depending on the shape of the mask used for exposure, the embossing structure may have a uniform dot array as shown in FIG. 5. In other exemplary embodiments, the embossing structure may have a substantially linear shape as shown in FIG. 6 or a substantially grating shape crossing the memory cell area, as shown in FIG. 7, ultimately forming the linear or grating shape of the memory active region.

In another exemplary embodiment of a method of manufacturing a memory device, the additional layer 600 may be formed by block copolymer etching. A polymer present in a form of copolymer having units with different etching selectivities is applied to a substrate, part of which is removed via plasma etching, thereby forming a dotted structure. In one exemplary embodiment, polystyrene-co-polymethylmethacrylate is applied onto a substrate to form an additional layer, which is then etched using UV, plasma and an organic solvent to remove polymethylmethacrylate, thereby forming the embossing structure in which the polystyrene unit is arrayed in uniform dot form as shown in FIG. 5.

With the additional layer 600 and the embossing structure 200 thus formed, a first electrode 300, an organic memory layer 400 and a second electrode 500 are sequentially formed, thus manufacturing the memory device.

In exemplary embodiments, a memory active region formed by the embossing structure 200, is preferably formed to be about 10 nm to about 500 nm in height or thickness in a direction substantially perpendicular to the first electrode 300 as measured from the first electrode 300. The height may be considered a distance from highest point on the memory active region to a corresponding upper surface of the first electrode 300. Advantageously, negative effects due to the introduction of fine dust and defects upon the process are reduced or effectively eliminated.

Figure 8:
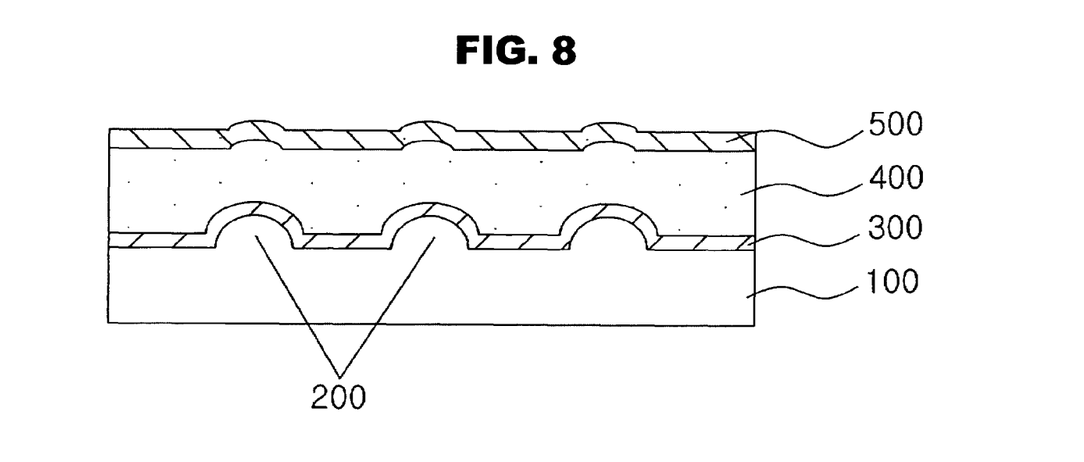
FIG. 8 is a cross-sectional view showing another exemplary embodiment of an organic memory device according to the present invention.

FIG. 8 is another exemplary embodiment of an organic memory device according to the present invention. The memory device is structured in a manner such that an embossing structure 200 is integrally formed with a substrate 100, such that the embossing structure 200 may actually be part of the substrate 100 as opposed to being separately "disposed on" the substrate 100. A first electrode 300, an organic memory layer 400 and a second electrode 500 are sequentially formed on the substrate 100.

The second electrode 500 may be a substantially planar shape, but portions of the second electrode 500 may be distorted in an area corresponding to the embossing structure 200 where the embossing structure 200 protrudes upward from the substrate 100.

In exemplary embodiments, the substrate 100 may include an organic or inorganic material. The substrate material may include glass or silicon. To form the embossing structure on the substrate, photolithography, e-beam lithography, or similar processes may be applied. Exemplary embodiments of the shape of the embossing structure include, but are not limited to, a uniform dot array, a linear array, or a grating array, as shown in FIGS. 5 to 7. In other exemplary embodiments, a memory active region, which may be formed by the embossing structure 200 integrally formed with the substrate 100, is preferably formed to be about 10 nm to about 500 nm in height from the first electrode 300 to advantageously eliminate negative effects due to the introduction of fine dust and defects upon the process.

Figure 9:
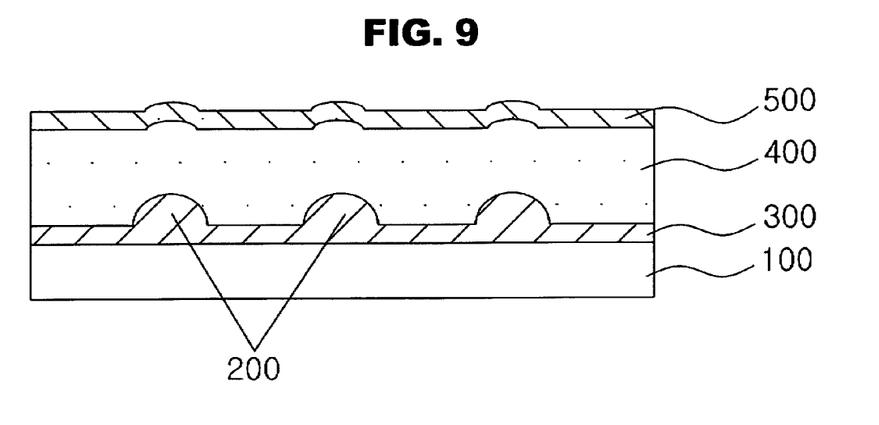
FIG. 9 is a cross-sectional view showing another exemplary embodiment of an organic memory device according to the present invention.

FIG. 9 is another example of an organic memory device according to the present invention. The memory device is formed in a manner such that a first electrode 300 is formed on a substrate 100, and an embossing structure 200 is integrally formed with the first electrode 300, followed by forming an organic memory layer 400 and then a second electrode 500.

The second electrode 500 may be a substantially planar shape, but portions of the second electrode 500 may be distorted in an area corresponding to the embossing structure 200 where the embossing structure 200 protrudes upward from the substrate 100.

A memory active region is realized by forming the first electrode 300 on the substrate 100 and then integrally forming the embossing structure 200 on the first electrode 300.

To form the embossing structure, photolithography, e-beam lithography, or similar processes may be applied. Exemplary embodiments of the shape of the embossing structure include, but are not limited to, a uniform dot array, a linear array, or a grating array, as shown in FIGS. 5 to 7. In other exemplary embodiments, a memory active region, is preferably formed to be about 10 nm to about 500 nm in height from the substrate 100 to advantageously eliminate negative effects due to the introduction of fine dust and defects upon the process.

Figure 10:
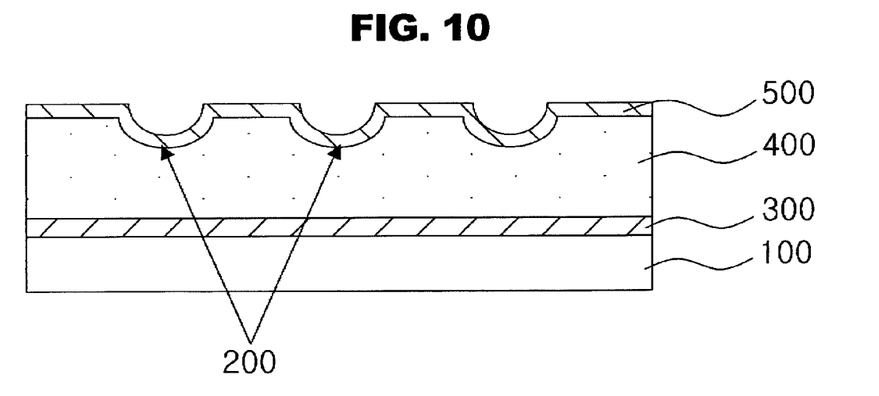
FIG. 10 is a cross-sectional view showing another exemplary embodiment of an organic memory device according to the present invention.

FIG. 10 is a cross-sectional view showing another exemplary embodiment of an organic memory device according to the present invention. The memory device is structured in a manner such that a first electrode 300 and an organic memory layer 400 are sequentially formed on a substrate 100. An upper surface of the organic memory layer 400 is processed to form an embossing structure 200 so as to assure a memory active region. A second structure (electrode) 500 is formed on the upper surface of the processed organic memory layer 400 and substantially corresponds to the profile defined by the processed organic memory layer. In alternative embodiments, the organic memory layer may be processed at a lower surface. Essentially, the embossing structure 200 may be disposed or provided in the organic insulating layer 400 to form the memory active region.

To form the embossing structure, photolithography, e-beam lithography, or similar processes may be applied. In other exemplary embodiments, a memory active region, is preferably formed to be about 10 nm to about 500 nm in height (or depth) from an upper surface of the second electrode 500 to advantageously eliminate negative effects due to the introduction of fine dust and defects upon the process.

In one exemplary embodiment of the organic memory device of the present invention, an organic or inorganic substrate formed of glass or silicon, and in particular, a flexible substrate, may be used.

In one exemplary embodiment of a method of forming the organic memory device according to the present invention, the organic memory layer is formed of dielectric organic material or semiconducting organic material, and the composition of the organic memory layer of the organic memory device may vary with the switching type of the memory device.

In another exemplary embodiment of the organic memory device of the present invention, the first electrode and second electrode are formed of at least one conducting material selected from the group consisting of metals, metal alloys, metal nitrides, metal oxides, metal sulfides, carbon, conducting polymers, and organic conductors.

In another exemplary embodiment of a method of forming the organic memory device according to the present invention, it is possible to manufacture an organic memory device in a manner that induces change in resistance by forming and removing a metal filament in and from the organic material. Such a memory device has an MPM (Metal-Polymer-Metal) structure. In this memory device, an oxidation-reduction reaction of the electrode is caused by the movement (diffusion) of atoms (ions) in a solid electrolyte, and therefore the metal filament is formed and removed to generate switching.

Other exemplary embodiments according to the present invention include, a memory device for inducing change in resistance through capture of electrons by including metal nanoparticles in the organic material, a memory device for inducing change in resistance depending on ion distribution by including an ionic salt in the conducting polymer, and a memory device using an organic material having resistance varying with the oxidation-reduction reaction.

One exemplary embodiment of the memory device of the present invention using the oxidation-reduction reaction, may utilize the property of varying the conductivity of a conducting polymer depending on the state (trapped electron state or detrapped electron state) of a material, which is oxidized or reduced by an electrical signal, upon addition of such a material to the conducting polymer (monomer). In another exemplary embodiment, in the case of the memory device including nanoparticles, when metal particles having a diameter of 5 nm or less are dispersed in the insulating polymer, electrical charges are trapped or detrapped to the metal particles, thus causing variation in conductivity.

In one exemplary embodiment of the memory device including an ionic salt, an intermediate layer including a conducting polymer and an ionic salt such as NaCl or CsCl is interposed between upper and lower electrodes. As such, the ionic salt, such as NaCl, is dissociated by electrical potential, resulting in increased conductivity of the conducting polymer. Advantageously, when a relatively large number of ions are present near the conducting polymer, conductivity may be enhanced. Moreover, when the ions are divided substantially to both sides of the memory device, or toward each of the upper and lower electrodes, through application of higher voltage, the conductivity is decreased. Advantageously, the capability of the memory device to be used as a memory device is increased. In other exemplary embodiments, memory devices according to the present invention may include a structure including an organic layer between electrodes.

An exemplary embodiment of a method of manufacturing the memory device of the present invention is described with reference to the following example and comparative example which are set forth to illustrate, but are not to be construed to limit the present invention.

EXAMPLE

Figure 11:
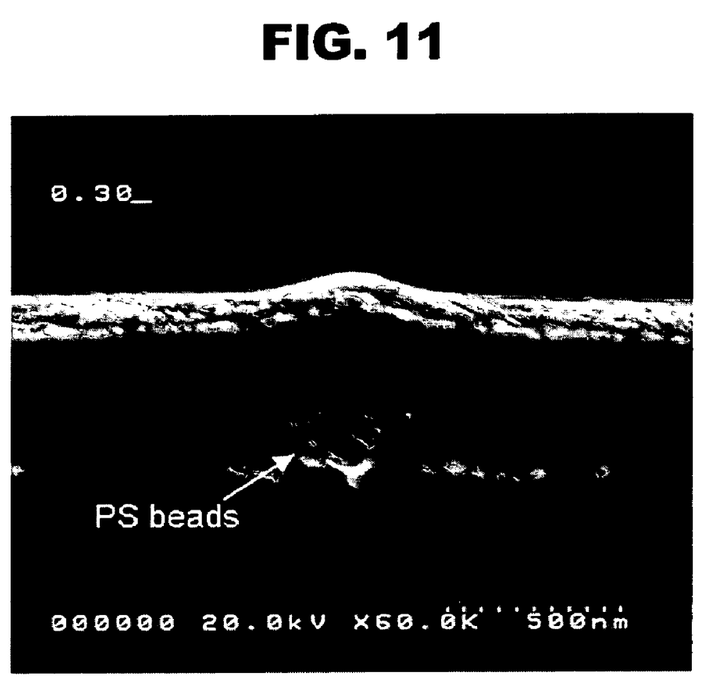
FIG. 11 is an SEM image showing the cross-section of the device manufactured in an exemplary method according to the present invention.

Polystyrene beads having a diameter of 0.3 μm and poly (sulfonate styrene) were mixed with water and then applied onto a wafer ultrasonic-washed with acetone through a spin-coating process to form an embossing structure. Subsequently, as a first electrode, aluminum was deposited to a thickness of 80 nm through thermal evaporation. A solution of $P_3HT$ (poly-3-hexylthiophene) was applied onto the aluminum electrode through a spin-coating process and then baked at 65° C. for 10 min to form a 40~50 nm thick organic memory layer. Copper as a second electrode was deposited to a thickness of 80 nm on the organic memory layer through thermal evaporation, thus manufacturing a test device of the present invention. FIG. 11 shows an SEM image of the cross-section of the test device thus manufactured.

Comparative Example

A test device was manufactured in the same manner as in the above example, with the exception that the step of applying the polystyrene beads through solution-coating to form an embossing structure was not conducted.

Figure 12A:
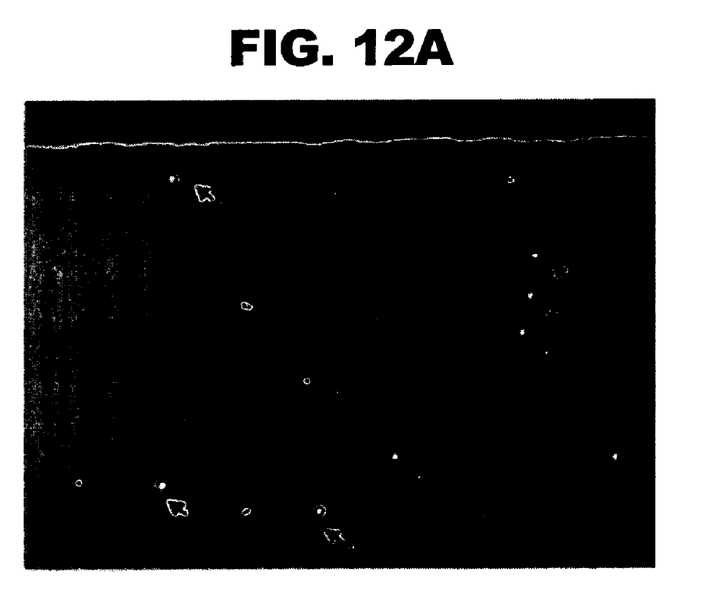
FIGS. 12A and 12B are optical micrographs showing the active region of the device of FIG. 11, before and after operation thereof.
Figure 12B:
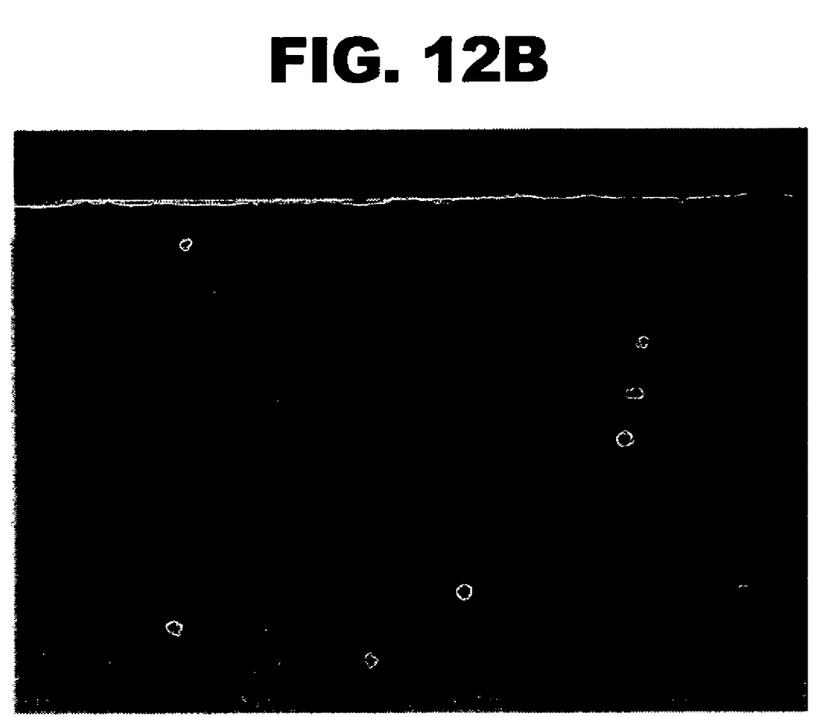

FIGS. 12A and 12B are photographs of the memory cells before and after switching, showing the distribution state of polystyrene beads constituting the embossing structure. As can be seen in FIGS. 12A and 12B, filaments are formed at and removed from the positions where the polystyrene beads (marked by arrows) of the embossing layer of the test memory device are formed, and thus pin holes are observed in the upper electrode.

Figure 13:
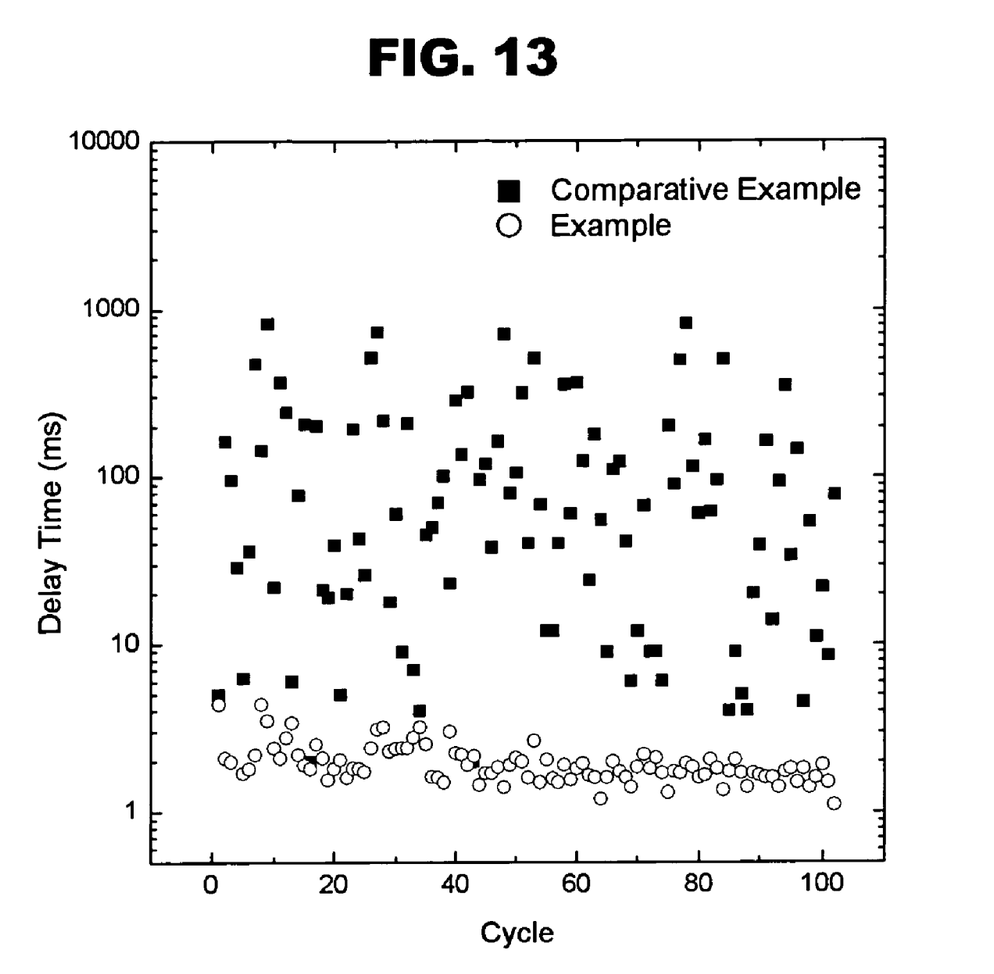
FIG. 13 is a graph showing the switching time measured while repeating switching of the device of FIG. 11 and a comparative example to 100 cycles.

FIG. 13 is a graph showing the delay time measured while repeating the switching of the memory device of each of the example and comparative example to 100 cycles. As is apparent from FIG. 13, the memory device of the comparative example, having no embossing structure, can be seen to have a very wide distribution of delay time. In contrast, the memory device of the present invention can be confirmed to drastically decrease the distribution of delay time.

One exemplary embodiment according to the present invention provides an organic memory device having a memory active region formed by an embossing structure. In one exemplary embodiment of a method of manufacturing the memory device according to the present invention, the organic memory device includes an organic layer formed through spin-coating. The distribution and length of switching delay time due to the dust and defects caused upon spin-coating for formation of the organic layer can be drastically decreased Advantageously, the operational reliability of the memory device in increased. In exemplary embodiments, the memory structure of the present invention may be applied to organic memory using metal filaments, organic memory using an oxidation-reduction reaction, or organic memory using metal ionic salts, as long as it is suitable for the purposes described herein, such as including an organic layer formed through spin-coating.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic memory device, comprising:
a substrate;
a first electrode formed on the substrate;
an organic memory layer formed on the first electrode;
a second electrode formed on the organic memory layer; and
an embossing structure between the substrate and the first electrode;
wherein said embossing structure includes a plurality of protrusions upward from the substrate,
said protrusions being uniformly sized in thickness and height and regularly patterned, so as to make the thickness of the organic memory layer uniform directly above the protrusions,
said embossing structure provided at portions of the organic memory layer to form memory active regions.

2. The organic memory device as set forth in claim 1, wherein the embossing structure comprises organic or inorganic particles.

3. The organic memory device as set forth in claim 2, wherein the particles have a diameter of about 10 nm to about 500 nm.

4. The organic memory device as set forth in claim 1, wherein the embossing structure is formed on an additional layer disposed between the substrate and the first electrode.

5. The organic memory device as set forth in claim 1, wherein the embossing structure is formed in a substantially dot shape.

6. The organic memory device as set forth in claim 1, wherein the embossing structure is formed in a substantially linear shape.

7. The organic memory device as set forth in claim 1, wherein the embossing structure is formed in a substantially grating shape.

8. The organic memory device as set forth in claim 1, wherein the memory active region is formed to be about 10 nm to about 500 nm high from an upper surface of the first electrode.

9. The organic memory device as set forth in claim 1, which is a metal-multifilament memory device.

10. The organic memory device as set forth in claim 1, which is a memory device for inducing change in resistance through capture of electrons by including metal nanoparticles in an organic material.

11. The organic memory device as set forth in claim 1, which is a memory device for inducing change in resistance through an ion distribution by including an ionic salt in a conducting polymer.

12. The organic memory device as set forth in claim 1, which is a memory device using an organic material having resistance varying with an oxidation-reduction reaction.

13. A method of forming an organic memory device, the method comprising:
disposing a first electrode on a substrate;
forming an organic memory layer on the first electrode;
forming a second electrode on the organic memory layer; and
providing an embossing structure between the substrate and the first electrode,
wherein said embossing structure includes a plurality of protrusions upward from the substrate,
said protrusions being uniformly sized in thickness and height and regularly patterned, so as to make the thickness of the organic memory layer uniform directly above the protrusions,
said embossing structure provided at portions of the organic memory layer to form memory active regions.

14. The method as set forth in claim 13, wherein the embossing structure comprises a substantially dot shape.

15. The method as set forth in claim 14, wherein the providing an embossing structure comprises surface-relief grating using radiation of interference light onto a polymer or monomer having an azo group.

16. The method as set forth in claim 14, wherein the providing an embossing structure comprises photolithography or e-beam lithography.

17. The method as set forth in claim 14, wherein the providing an embossing structure comprises block copolymer etching.

18. The method as set forth in claim 13, wherein the embossing structure comprises a substantially linear shape.

19. The method as set forth in claim 18, wherein the providing an embossing structure comprises photolithography or e-beam lithography.

20. The method as set forth in claim 13, wherein the embossing structure comprises a substantially grating shape.

21. The method as set forth in claim 20, wherein the providing an embossing structure comprises photolithography or e-beam lithography.

* * * * *